US005504701A

United States Patent [19]

Takahashi et al.

[11] Patent Number: 5,504,701

[45] Date of Patent: Apr. 2, 1996

[54] MEMORY CARD

[75] Inventors: Masashi Takahashi, Tokyo; Takashi Ikegami, Yokosuka, both of Japan

[73] Assignee: Toppan Printing Co., Ltd., Tokyo, Japan

[21] Appl. No.: 314,629

[22] Filed: Sep. 29, 1994

[30] Foreign Application Priority Data

| | | | |
|---|---|---|---|
| Sep. 30, 1993 | [JP] | Japan | 5-268418 |
| Sep. 30, 1993 | [JP] | Japan | 5-268419 |
| Sep. 30, 1993 | [JP] | Japan | 5-268420 |

[51] Int. Cl.$^6$ .............................. G11C 7/02; G06K 5/00

[52] U.S. Cl. .................... 365/185.04; 365/900; 365/218; 365/236; 235/492; 235/380

[58] Field of Search ................................ 365/52, 55, 236, 365/94, 104, 900, 218; 235/492, 380

[56] References Cited

U.S. PATENT DOCUMENTS 5,264,689 11/1993 Maes et al. ............................ 235/380
5,285,415 2/1994 Depret et al. ...................... 365/189.01

*Primary Examiner*—David C. Nelms
*Assistant Examiner*—Huan Hoang
*Attorney, Agent, or Firm*—Burns, Doane, Swecker & Mathis

[57] ABSTRACT

A memory card of the present invention serves as a reusable prepaid card. In the memory card, prepaid-money data is stored in a user memory constituted of a flash erase type EEPROM, and decreased as the card is used. When the prepaid-money data becomes zero, the user memory is initialized for reuse. The memory card includes an EPROM to which data of a predetermined number of times of initialization is preset and which decreases in data of the number of times of initialization and an initialization control logic for executing initialization in response to an initialization command until data of the EPROM becomes zero, and inhibiting the initialization even though the initialization command is input when the data becomes zero.

16 Claims, 7 Drawing Sheets

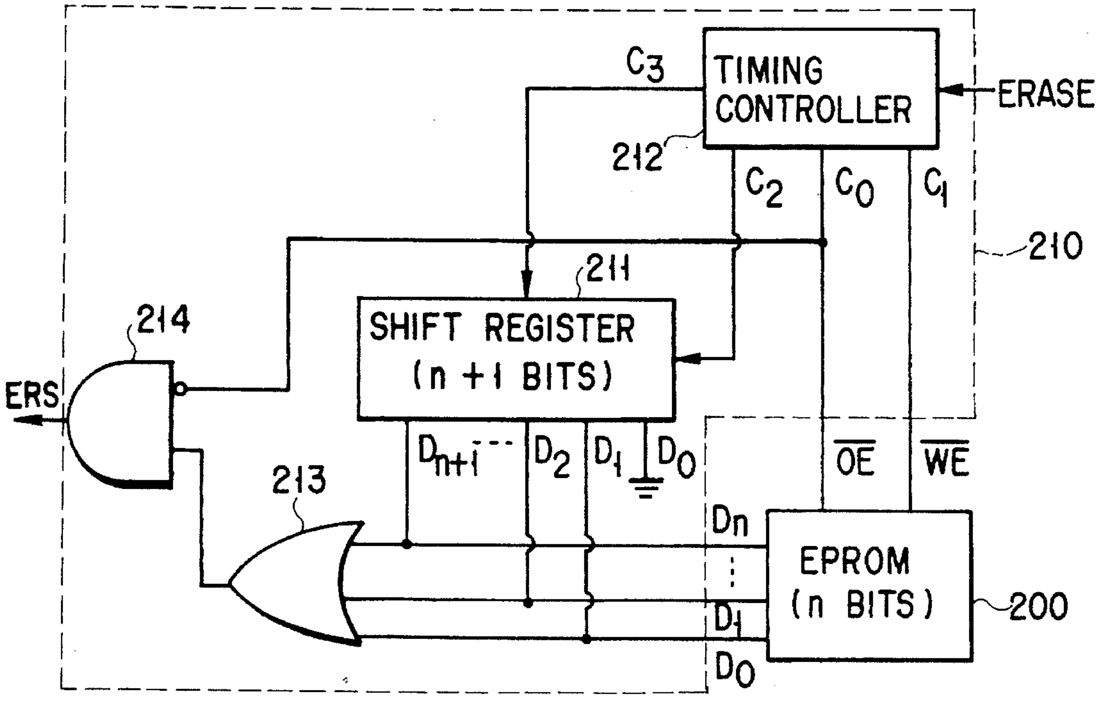
FIG. 2
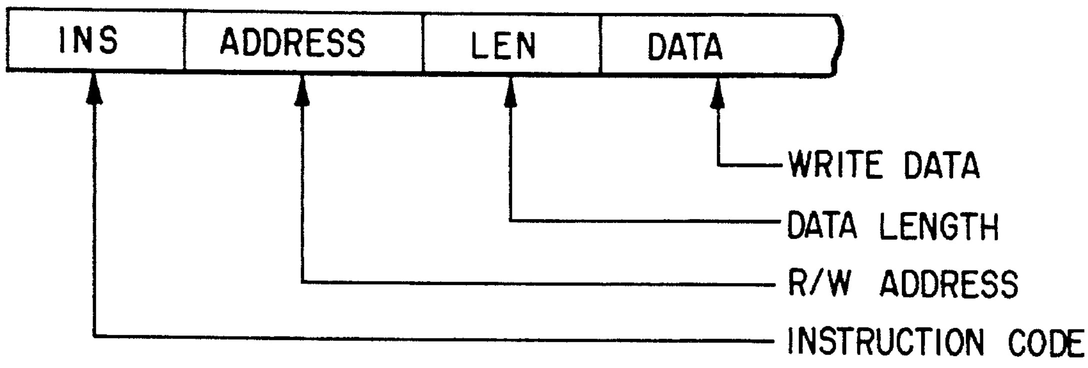
FIG. 3A
FIG. 3B
| INS | COMMAND |
|---|---|
| $ 00 | READ |
| $ 01 | WRITE |
| $ 02 | ERASE |

| | EPROM 200 | | | AND GATE 214 | | |
|---|---|---|---|---|---|---|
| | | | | INPUT | | OUTPUT (ERS) |
| | $D_2$ | $D_1$ | $D_0$ | $C_0$ | OR 213 OUTPUT | |
| ISSUED | 1 | 1 | 1 | 0 | 1 | 1 |
| ERASED ONCE | 1 | 1 | 0 | 0 | 1 | 1 |
| ERASED TWICE | 1 | 0 | 0 | 0 | 1 | 1 |
| ERASED THRICE | 0 | 0 | 0 | 0 | 0 | 0 |

| OE (overlined) | CLK | CLR | FUNCTION |
|---|---|---|---|
| 0 | * | * | READ |
| * | rising edge | 0 | COUNT UP(+1) |
| * | * | 1 | CLEAR |

MEMORY CARD

BACKGROUND OF THE INVENTION

1. Field of the Invention

The present invention relates to a memory card usable as a prepaid card or the like and, more particularly, to a memory card including a nonvolatile semiconductor memory capable of being rewritten or initialized to be reused.

2. Description of the Related Art

It is a magnetic card that has been used conventionally as the main stream of a prepaid card. The magnetic card is constituted such that a magnetic substance is applied to part of one side of a card substrate of plastics or the like and data corresponding to the amount of prepaid money is magnetically recorded on the magnetic part of the card substrate. The magnetic card has the drawback wherein it is easy to be counterfeited because of simple structure and low cost for counterfeit, though its manufacturing cost is low. To eliminate the drawback, an IC memory card (simply referred to as a memory card hereinafter) mounted with an IC memory has recently been used as a prepaid card since the memory card is so high in cost for counterfeit that it cannot be counterfeited. In the memory card, a memory section (memory cell) for recording data is constituted of fuse memories incapable of being rewritten, and the amount of used money is counted and recorded by disconnection of the fuse memories.

However, if, in the above memory card, the prepaid money are completely spent, all the fuse memories are cut off, and the memory card has to be thrown away since it cannot be used any more. The memory card is therefore unfavorable for protection of resources and prevention of environmental pollution. Since, furthermore, the memory card cannot be reused, its own manufacturing cost is increased.

The fuse memories can be replaced with an EEPROM (Electrically Erasable Programmable ROM) in order to reuse the prepaid card. If, however, a rewrite operation is allowed without restriction, the following drawback occurs: In case a write command leaks out to a user, the user is likely to rewrite the EEPROM and to use the prepaid card without restriction.

SUMMARY OF THE INVENTION

The present invention has been developed in consideration of the above situation and its object is to provide a new, improved memory card which can be reused without dishonesty.

A memory card according to the present invention comprises:

memory means capable of being initialized;

initialization means for initializing the memory means upon receiving an initialization command;

count means for counting the number of times the memory means is initialized by the initialization means; and initialization control means for, when the number of times counted by the count means is equal to or larger than a predetermined value, inhibiting the initialization means from being operated.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 2 is a block diagram showing an erase control logic of the memory card according to the first embodiment;

FIG. 3A is a view showing a format of commands supplied from a terminal device to the memory card shown in FIG. 1;

FIG. 3B is a table showing command codes;

DETAILED DESCRIPTION OF THE PREFERRED EMBODIMENTS

A preferred embodiment of a memory card according to the present invention will now be described with reference to the accompanying drawings. The following descriptions are based on the premise that the memory cards are used as prepaid cards, such as a telephone card.

Figure 1:
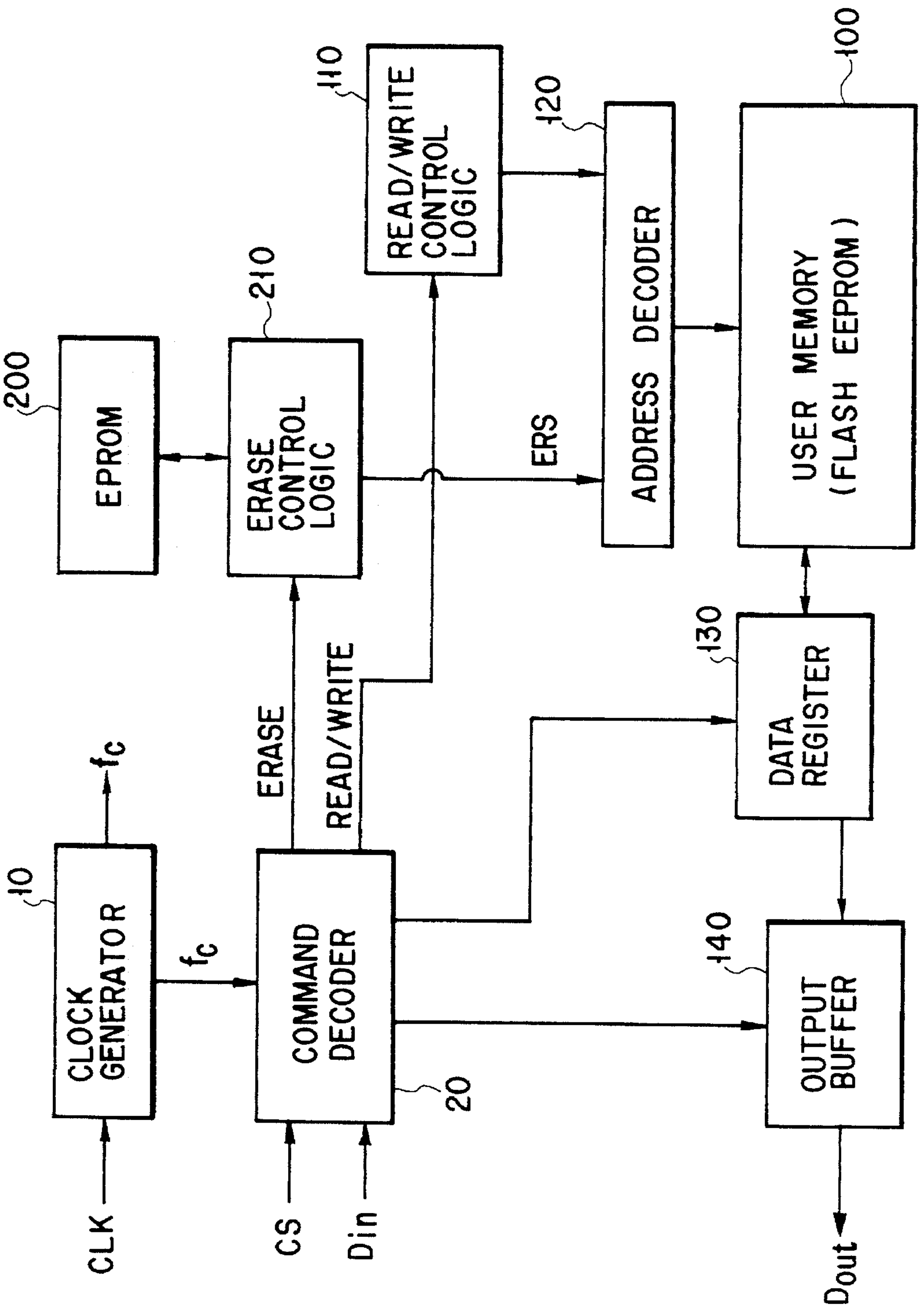
FIG. 1 is a block diagram showing a memory card according to a first embodiment of the present invention.

The memory cards of the present invention each includes an IC chip mounted on a plastic card substrate. FIG. 1 shows a circuit formed on an IC chip of a memory card according to the first embodiment of the present invention.

The circuit shown in FIG. 1 includes a user memory 100 of a flash erase EEPROM, a wired logic circuit for controlling read, write and erase operations for a number of memory cells constituting the user memory 100, and the like. Data of a predetermined number of memory cells of the user memory 100 are preset to "1" and rewritten in sequence from "1" to "0" by a user terminal device (e.g., public telephone) in accordance with the call units. The number of memory cells set to "1" represents the balance of prepayment. When the balance is zero, i.e. when data of all the memory cells are set to "0", a card issuer terminal device allows data of a predetermined number of memory cells of the user memory 100 to be rewritten from "0" to "1"

simultaneously; therefore, the memory card can be reused. This simultaneous rewrite operation is called erase or initialization.

The terminal device (including both the user and card issuer terminal devices) supplies a sync clock CLK to a clock generator 10, and the clock generator 10 generates an internal clock fc. The terminal device also supplies a command (CS: Chip Select, Din: Data Input), and the command is input to a command decoder 20 in synchronization with the internal clock fc. The command decoder 20 outputs an erase signal ERASE and a read/write signal READ/WRITE to an erase control logic 210 (the details of which are shown in FIG. 2) and a read/write control logic 110, respectively, in response to the input command. The control logics 210 and 110 are each constituted by a wired logic for performing read, write and erase operations for the respective memory cells of the user memory 100 through an address decoder 120 in response to the signals output from the command decoder 20.

The format of commands input to the command decoder 20 is shown in FIG. 3A. The commands include an instruction code INS, an address ADDRESS, a data length LEN, and a data DATA. As shown in FIG. 3B, the instruction code INS has "$00", "$01" and "$02" representing a read command, a write command, and an erase command, respectively.

The user memory 100 is employed as a user's data memory, and a predetermined number of memory cells thereof are preset to the initial value "1". When the prepaid card is used as a telephone card, the number of memory cells preset to the initial value "1" corresponds to the call units usable by the prepaid card. The user memory 100 is accessed through the address decoder 120 for address control and data register 130 for data control. The data register 130 supplies data to the terminal device via an output buffer 140.

Data of the memory cells of the user memory 100 corresponding to the call units are sequentially rewritten from "1" to "0" in response to a command from the user terminal device. When data of all the memory cells are rewritten to "0", the prepaid card cannot be used any more. To not discard but reuse the card, it is so designed that the card issuer is able to rewrite (initialize or erase) all data of a predetermined number of memory cells of the user memory 100 to "1" at the same time.

The read/write control logic 110 controls a read/write operation for each memory cell of the user memory 100 in response to a command input to the command decoder 20 from outside. The read/write control logic 110 is a circuit for controlling the timing and Vpp of the data read/write operation.

An EPROM (Electrically Programmable ROM) 200 for counting the number of initialization of the user memory 100, is connected to the erase control logic 210. In the first embodiment, not the number of times of erase itself, but the remaining number of times allowing an erase operation, is stored in the EPROM 200 and, when the data (the remaining number) stored in the EPROM 200 becomes 0, the erase control logic 210 inhibits the erase operation. For this reason, the EPROM 200 has memory cells the number of which corresponds to the number of times the prepaid card can be initialized, and inverts data of the memory cells whenever the card is initialized. This initialization can be continued until data of all the memory cells are inverted. It should be noted that the EPROM 200 differs from the user memory 100 in that it is incapable of being rewritten (or initialized). The EPROM 200 can be replaced with a fuse ROM having fuses the number of which corresponds to the number of times allowing the initialization, to cut off the fuses every initialization. In either case, it is necessary that the EPROM 200 cannot be accessed (or rewritten) by the external terminal device. The card can thus be prevented from being initialized (reused) over a predetermined number of times and can be prevented from being used dishonestly without restriction.

The erase control logic 210 may inhibit the erase operation when the number of times of erase amounts to a predetermined number stored in the EPROM 200.

FIG. 2 is a block diagram showing the details of the erase control logic 210. The erase control logic 210 comprises a timing control circuit 212, which has a binary up-counter, a comparator, and the like, for outputting timing signals $C_0$ to $C_3$ at predetermined timing, upon receiving the erase command ERASE from the command decoder 20. The binary up-counter counts the outputs of a CR timer (not shown) incorporated therein or the internal clocks fc generated from the clock generator 10, and measures time. The comparator compares the values counted by the binary up-counter with a preset value to determine whether the timing signals are to be output. The output signals $C_0$ and $C_1$ of the timing control circuit 212 are supplied to an output enable terminal $\overline{OE}$ and a write enable terminal $\overline{WE}$ of the EPROM 200, respectively. While the output signal $C_2$ is a timing signal for fetching the data of the EPROM 200 to a shift register 211, the output signal $C_3$ is a timing signal for shifting the contents of the shift register 211 to the right (to the upper bit). Upon shifting of the data to the upper bit, "0" is set to the least significant bit. The falling edges of signals $C_2$ and $C_3$ are significant (see FIG. 4).

The EPROM 200 has an n-bit structure, whereas the shift register 211 has an n+1-bit structure. Data terminals $D_0$ to $D_n$ of the EPROM 200 are connected to data terminals $D_1$ to $D_{n+1}$ of the shift register 211, respectively, and also connected to the input terminals of an OR gate 213. The least significant bit data terminal $D_0$ of the shift register 211 is connected to a ground level "0".

The output of the OR gate 213 is supplied to a first input terminal of an AND gate 214. The output signal $C_0$ of the timing control circuit 212 is inverted, and the inverted signal is supplied to a second input terminal of the AND gate 214. The output signal of the AND gate 214 is input to the address decoder 120 as an erase control signal ERS. When the signal ERS is equal to "0", data of the user memory 100 is inhibited from being erased (initialized). When ERS is equal to "1", the data is allowed to be erased (initialized).

An operation of the memory card according to the first embodiment of the present invention, will now be described.

When a user inserts the memory card into a public telephone to make a call, the telephone rewrites data of a memory cell of the user memory 100 from "1" to "0" whenever a predetermined call time elapses. When data of all the memory cells are rewritten to "0", the user cannot call any more. To allow the memory card to be reused afterward, the card issuer initializes the user memory 100 to change the data of a predetermined number of memory cells to "1" at once, using the terminal device. This initialization (erase) will be described with reference to the timing chart shown in FIG. 4.

The memory card of the first embodiment determines whether data can be erased or not when receiving an erase command (a command to initialize the user memory 100) from an external device (e.g., a card writer). If it is determined that data can be erased, the erase is executed. If not, the erase is not executed. Whether data can be erased depends upon whether the number of times of erase reaches a predetermined value. More specifically, when the erase (initialization) is completed, the data of the EPROM 200, which represents the remaining number of times the erase operation can be performed, is updated (decremented in units of one). If the remaining number is 0, data cannot be erased.

The initialization of the user memory 100 is to rewrite data of the predetermined number of memory cells to the initial value "1" at once. For example, even though 50 call units of a telephone card are used up, they can be recovered by the initialization.

The command decoder 20 decodes an externally supplied command. When the command decoder decodes a read command, it supplies a read signal and its address signal to the read/write control logic 110, thereby reading data of a designated memory cell. This read operation is carried out at the beginning of use of the memory card to check the remaining call units of the card. When the remaining call unit is 0, a call cannot be started.

When a call is started, a telephone charge is added whenever a predetermined period of time elapses, and a telephone rewrites in sequence data of each memory cell of the card from "1" to "0". The telephone therefore outputs a write command (to write data "0") every time a predetermined period of time elapses. When the command decoder 20 decodes a write command, a write command signal, its address signal, and write data ("0") are supplied to the read/write control logic 110, with the result that data of a designated memory cell is rewritten to "0". When the telephone charges are added, the terminal device reads data of the memory cells and, if the data of all the memory cells are rewritten to "0", forces the call to end after a lapse of a given period of time.

Figure 4:
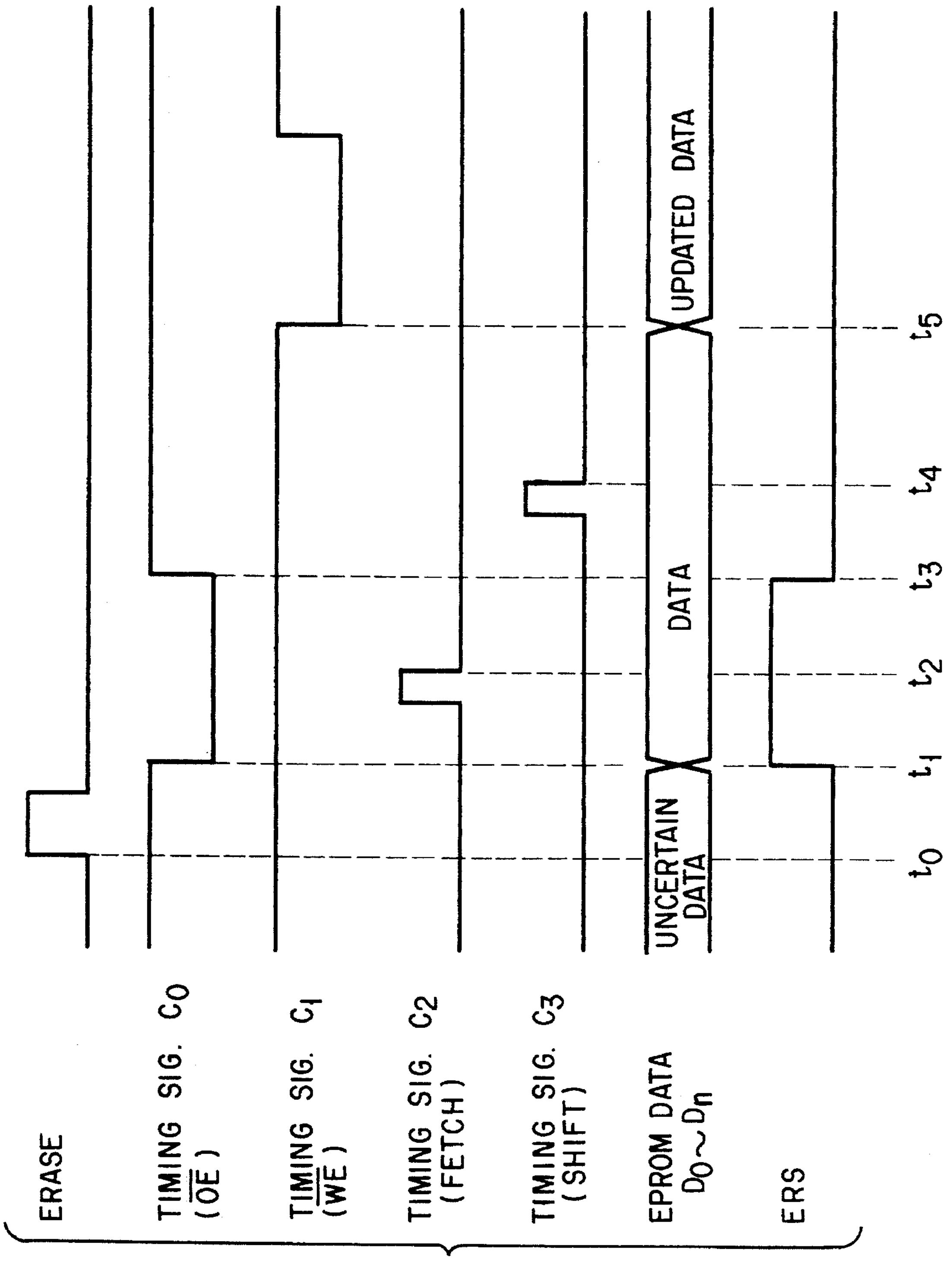
FIG. 4 is a timing chart showing an operation of the memory card according to the first embodiment.

If the command decoder 20 decodes an erase command (initialization command), it supplies an erase command ERASE to the erase control logic 210 (timing $t_0$), as shown in FIG. 4. The initial values of timing signals $C_0$ and $C_1$ of the timing control circuit 212 are each "1" and those of timing signals $C_2$ and $C_3$ thereof are each "0". Upon receiving the erase command ERASE, the timing control circuit 212 changes the timing signal $C_0$ from "1" to "0" after a lapse of a predetermined period of time (timing $t_1$). The timing signal $C_1$ remains at "1". The EPROM 200 is therefore set in an output enable state, and data, which corresponds to the remaining number of times the card can be initialized, are read out from the data terminals $D_0$ to $D_n$ of the EPROM 200 and then supplied to the AND gate 214 through the OR gate 213.

When the AND gate 214 outputs the erase control signal ERS and the number of times of erase amounts to the allowable value, data of the EPROM 200 are all set to "0". When the number of times of erase is smaller than the allowable value, if the timing signal $C_0$ is changed from "1" to "0" in response to the erase command ERASE, the AND gate 214 issues its inverted signal as the erase control signal ERS. When the number of times of erase exceeds the allowable value, it does not issue the signal ERS even when the timing signal $C_0$ is changed to "0".

The command decoder 20 sets the initialization data "1" to the data register 130, and the address decoder 120 generates addresses of a predetermined number of memory cells to be initialized in response to the erase control signal ERS. Thus data of a predetermined number of memory cells are initialized as "1" and the memory card can be reused accordingly.

When a predetermined period of time elapses further, the timing control circuit 212 sets the timing signal $C_2$ to level "1" for the given period of time. The shift register 211 receives data from the data terminals $D_0$ to $D_2$ of the EPROM 200 to the data terminals $D_1$ to $D_3$ in synchronization with the fall of the timing signal $C_2$ (timing $t_2$).

If the timing signal $C_0$ is returned to "1" at timing $t_3$ after all the data are erased at once, the output of the AND gate 214 is rendered at "0", and the erase control signal ERS stops issuing therefrom. When the timing signal $C_3$ is changed from "1" to "0" at timing $t_4$, data of the shift register 211 is shifted toward the most significant bit while "0" is set to the least significant bit. When the timing signal $C_1$ is changed to "0" at timing $t_5$, the EPROM 200 is set in a write enable state, and the shifted data is written back to the EPROM 200, thereby updating data representing the number of times allowing the initialization.

Whenever an erase operation is performed, data of each bit of the EPROM 200 are changed to "0" in sequence, starting from the least significant bit. When the prescribed number of erase operations are completed, all bits of the data are changed to "0". Therefore, the output of the OR gate 213 is changed to "0", and the AND gate 214 is incapable of generating the erase control signal ERS.

Figures 5, 6, 7:
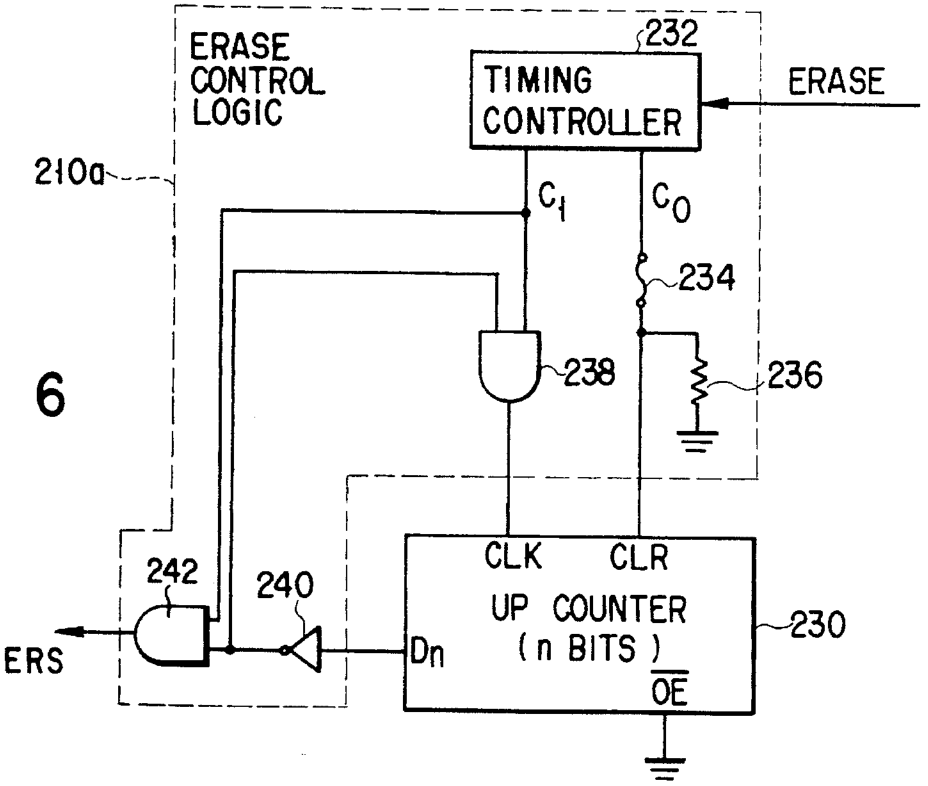
FIG. 5 is a table showing signal levels indicative of operations of respective sections of the memory card according to the first embodiment.
FIG. 6 is a block diagram showing an erase control logic of a memory card according to a second embodiment of the present invention.
FIG. 7 is a table showing an operation of a counter of the erase control logic shown in FIG. 6.

FIG. 5 shows signal levels indicating an operation of the erase control logic 210 performed when the number of times allowing the initialization is three.

According to the memory card of the first embodiment which can be reused by means of a rewritable semiconductor memory, when the number of times allowing the erase operation, which is preset to the EPROM 200 serving as an externally inaccessible counter, is decreased to zero, the initialization of the user memory 100 is inhibited. Therefore, the number of times of initialization can be always restricted to a predetermined value. Even though the initialization command leaks out to a user, the memory card can be prevented from being used dishonestly without restriction. Since the erase control logic 210 is constituted by an externally inaccessible wired logic circuit, the number of times of initialization cannot be rewritten dishonestly. The memory card of the present invention is superior in protection of resources and prevention of environmental pollution to a disposable prepaid card and has the advantage of lower manufacturing costs per sheet than that of the disposable prepaid card.

A memory card according to the second embodiment of the present invention will now be described. In the second embodiment, the same components as those of the first embodiment are indicated by the same reference numerals and their detailed descriptions are omitted.

FIG. 6 is a circuit diagram showing the details of an erase control logic 210*a* of the memory card of the second embodiment. Since the entire circuit of the second embodiment is the same as that of the first embodiment shown in FIG. 1, its description is omitted.

The erase control logic 210*a*, which is a wired logic circuit including a binary up-counter, a comparator, and the like, comprises a timing control circuit 232 for outputting timing signals $C_0$ and $C_1$ at predetermined timing upon receiving an erase command ERASE from the command decoder 20. The binary up-counter counts the outputs of a CR timer (not shown) incorporated therein or the internal clocks fc generated from the clock generator 10, and measures time. The comparator compares the values counted by the binary up-counter with a predetermined value to determine whether the timing signals are to be output. The output signal $C_0$ of the timing control circuit 232 is supplied to a clear terminal CLR of an n-bit binary up-counter 230 via a fuse 234, and the output signal $C_1$ thereof is supplied to a clock terminal CLK of the counter 230 via an AND gate 238. A connecting point between the clear terminal CLR and fuse 234 is grounded through a pull-down resistor 236. If the fuse 234 is cut off, the clear terminal CLR is set to "0", and the counter 230 cannot be cleared.

The n-th bit (most significant bit) output signal of the counter 230 is supplied as an erase control signal ERS to the address decoder 120 through an inverter 240 and an AND gate 242. The output signal $C_1$ of the timing controller 232 is supplied to the AND gate 240. The output signal of the inverter 240 is supplied to the AND gate 238. An output enable terminal $\overline{OE}$ of the counter 230 is grounded.

FIG. 7 shows an operation mode of the counter 230. When the output enable terminal $\overline{OE}$ is at "0", the counter 230 is set in a read mode and outputs a count value, irrespective of the conditions of the other terminals CLK, CLR. When the clear terminal CLR is at "0", the counter 230 counts up (+1) in accordance with the rise of the clock terminal CLK, irrespective of the condition of the output enable terminal $\overline{OE}$. When the clear terminal CLR is at "1", the counter 230 clears the count values, irrespective of the conditions of the other terminals $\overline{OE}$, CLK.

Figure 8:
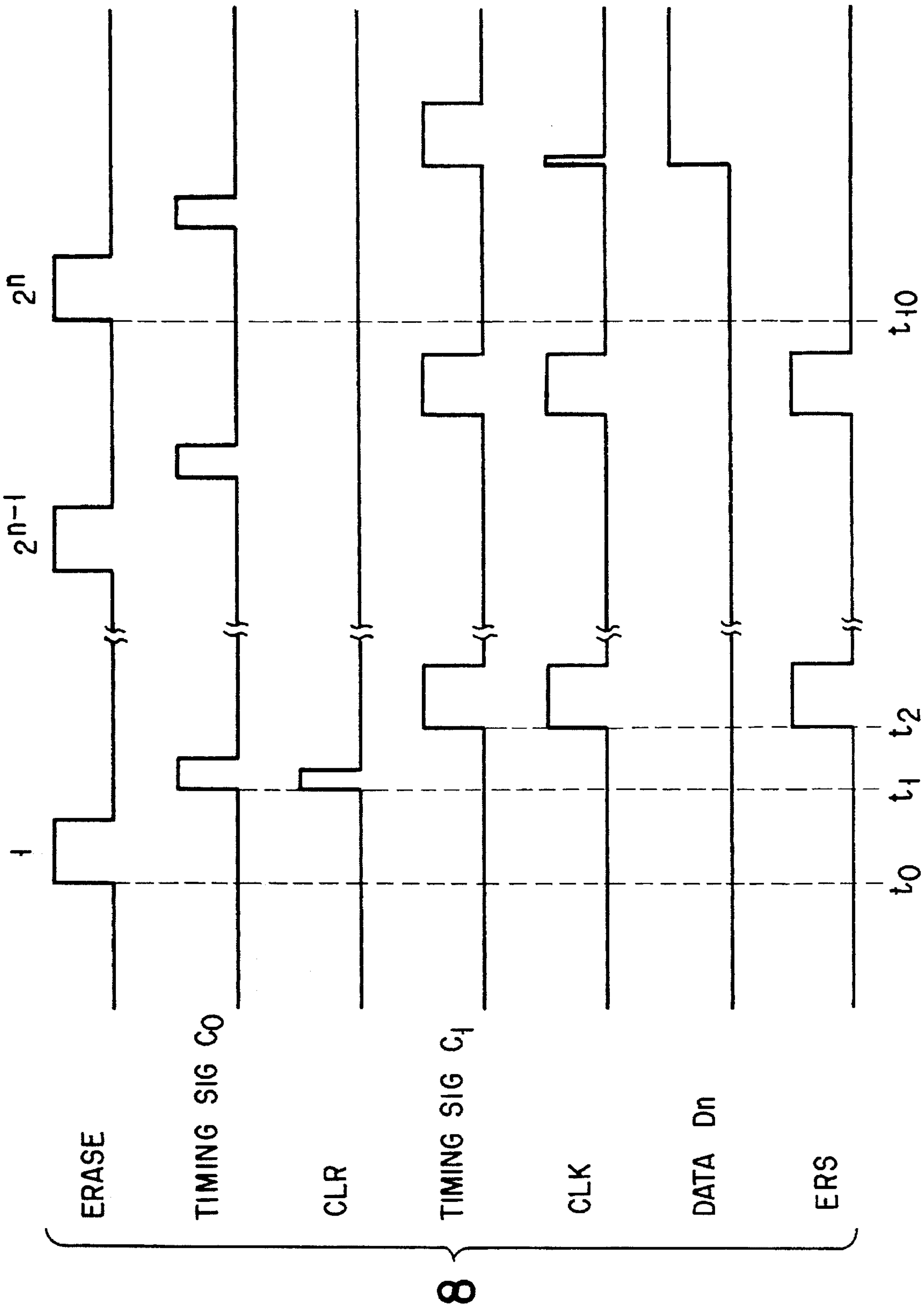
FIG. 8 is a timing chart showing an operation of the memory card according to the second embodiment.

The initialization (erase) operation of the memory card according to the second embodiment will now be described, with reference to FIG. 8.

When the command decoder 20 decodes an erase (initialization) command, it supplies an erase command ERASE to the erase control logic 210*a* (timing $t_0$). Upon reception of the erase command ERASE, the timing control circuit 232 changes the timing signal $C_0$ from "0" to "1" after a lapse of a predetermined period of time (timing $t_1$ ), and keeps the level "1" for a predetermined period of time. The clear terminal CLR of the counter 230 is therefore changed to "1". If, however, a given amount of current flows to cut the fuse 234, the clear terminal CLR is fixed to "0". The counter 230 is inhibited from being cleared afterward, and the number of times of erase cannot be changed dishonestly, with the result that the memory card can be prevented from being reused without restriction.

When a predetermined period of time elapses further, the timing control circuit 212*a* sets the timing signal $C_1$ at "1" (timing $t_2$) and keeps the level "1" for the given period of time. There are many cases where the data terminal $D_n$ of the most significant bit of the counter 230 is set to "0" in the initial state. Even if the data terminal $D_n$ is set to "1" in the initial state, the counter 230 can be cleared since the clear terminal CLR remains at "1" for a predetermined period of time by the timing signal $C_0$. Thus, the data terminal $D_n$ is always set to "0" at timing $t_2$. For this reason, the timing signal $C_1$ is supplied to the clock terminal CLK of the counter 230 as it is, and the counter 230 counts the number of times of erase.

Since the data terminal $D_n$ of the counter 230 is set to "0", the AND gate 242 is conductive so that the timing signal $C_1$ is output to the terminal device as the erase control signal ERS. The erase operation is thus performed.

Since the fuse 234 is cut off before the second erase operation, the clear terminal CLR of the counter 230 remains at "0" even though the timing signal $C_0$ is generated. Further, since the data terminal $D_n$ is at "0" until the count value amounts to $2^n$, the counter 230 continues to up-count the timing signal $C_1$ corresponding to the erase command ERASE.

The timing signal $C_0$ is output after a lapse of a predetermined period of time after the $2^n$-th erase command ERASE is supplied (timing $t_{10}$), and the timing signal $C_1$ is output after a predetermined period of time elapses further. The clock terminal CLK is changed to "1" in response to the timing signal $C_1$, and the counter 230 counts up to obtain a count value of $2^n$. The data terminal $D_n$ is therefore set to "1". Therefore, the AND gates 238 and 242 are rendered nonconductive so that the erase control signal ERS is not generated. Afterward, the counter 230 does not count up and data cannot be erased.

As described above, since an erase control signal ERS is inhibited from issuing when the number of times of erase counted by the counter 230 which can be cleared only once, amounts to a predetermined value $2^{n-1}$, in this embodiment, the memory card of the second embodiment can be reused by means of a rewritable semiconductor memory. In this memory card, the number of times of rewrite can always be restricted to a predetermined value. Even though the initialization command leaks out to a user, the memory card can be prevented from being used dishonestly without restriction. Since the erase control logic 210*a* is constituted by an externally inaccessible wired logic circuit, the number of times of initialization cannot be changed dishonestly. The memory card of the present invention is superior in protection of resources and prevention of environmental pollution to a disposable prepaid card and has the advantage of lower manufacturing costs per sheet than that of the latter card.

Figure 9:
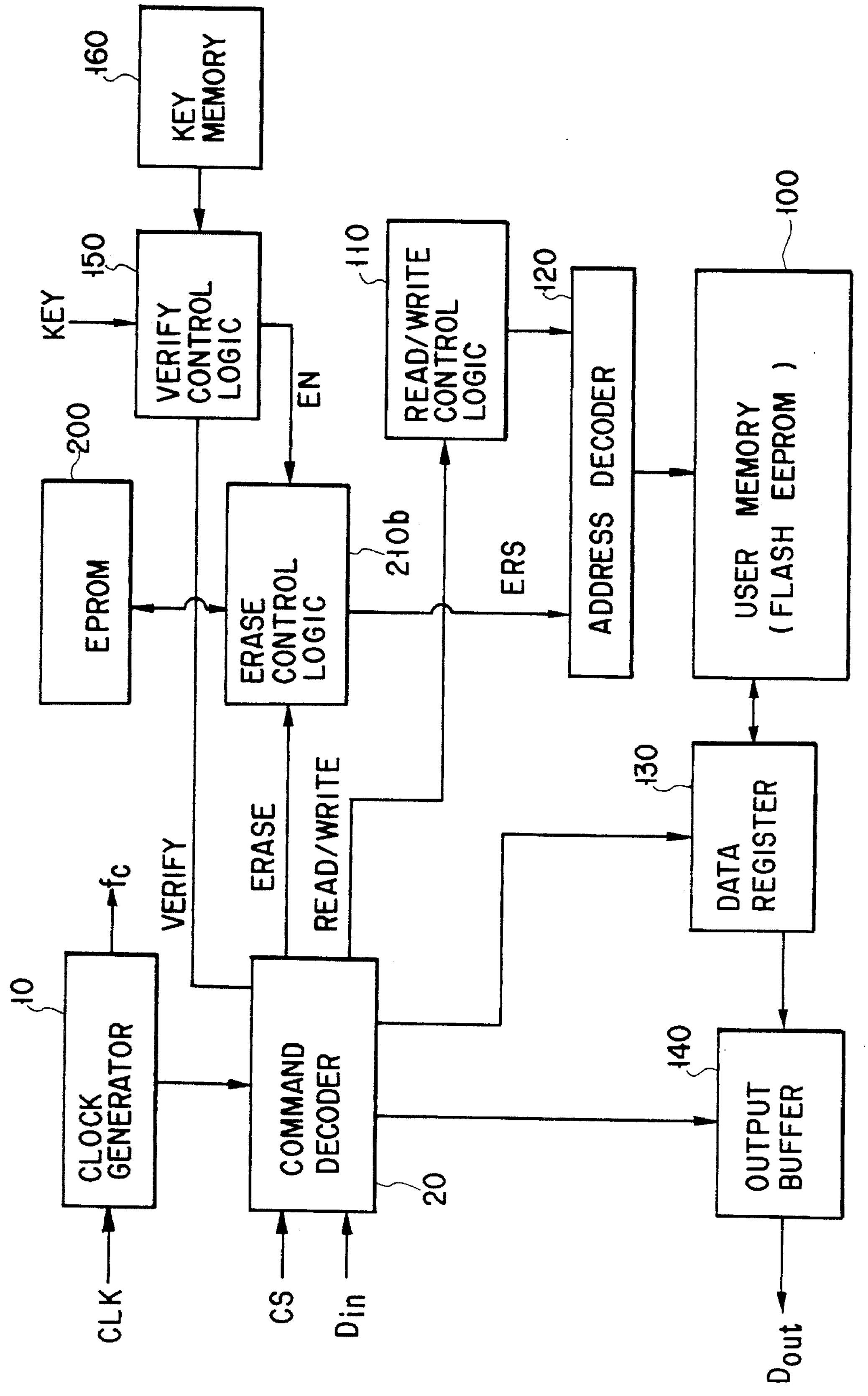
FIG. 9 is a block diagram showing a memory card according to a third embodiment of the present invention.
Figure 10:
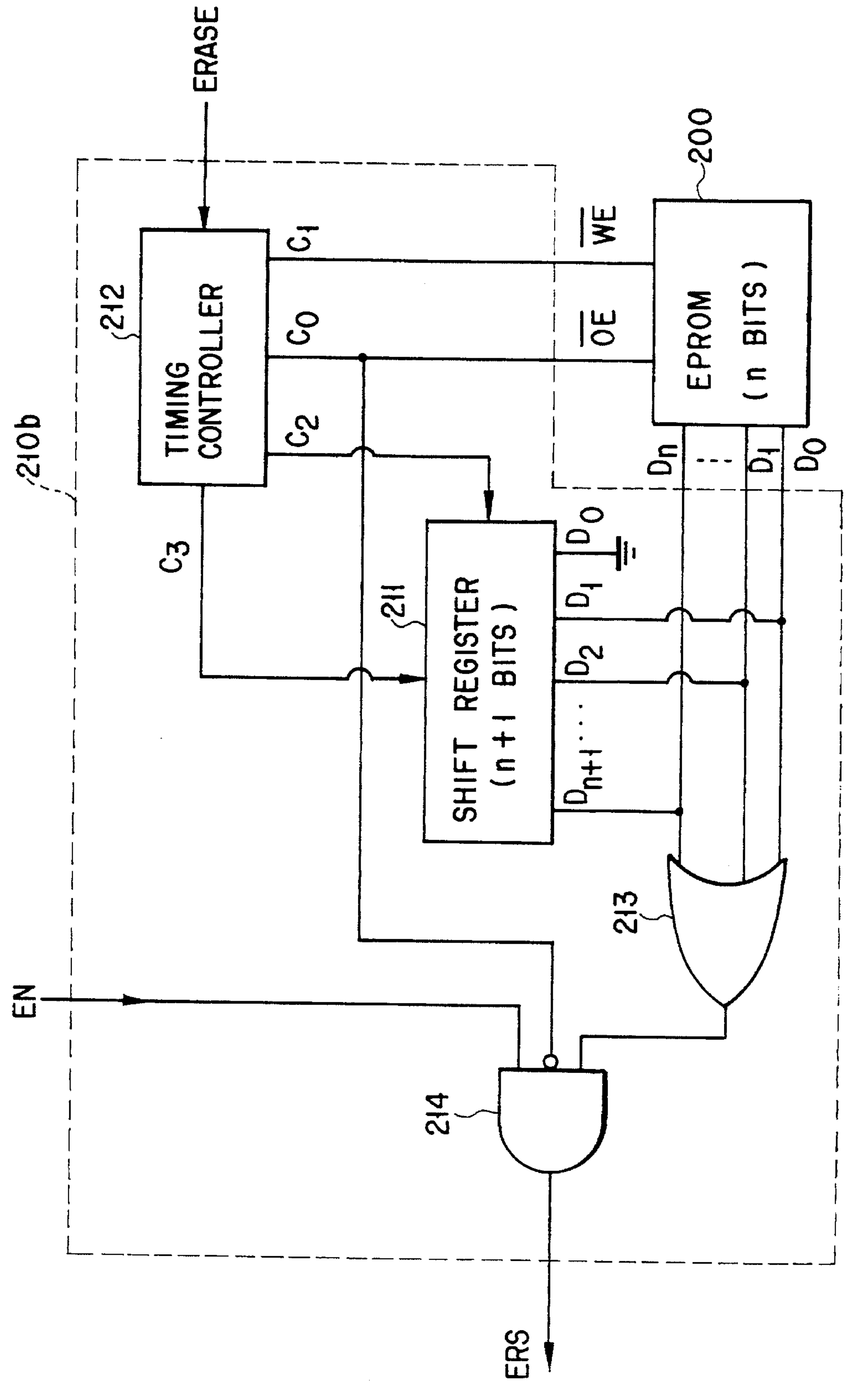
FIG. 10 is a block diagram showing an erase control logic of the memory card according to the third embodiment.

FIG. 9 is a block diagram showing a memory card of the third embodiment of the present invention and corresponds to FIG. 1 showing that of the first embodiment. FIG. 10 is a block diagram showing the details of an erase control logic 210*b* of the memory card of the third embodiment and corresponds to FIG. 2.

In the first and second embodiments, since an erase operation is performed in response to an erase command supplied from the terminal device, if the erase command is leaked to a user, he or she rewrites the memory card dishonestly by the above-mentioned predetermined number of times by means of a user terminal device. To eliminate this problem, the third embodiment requires not only the erase command but also key verification for verifying a user who is authorized to rewrite a memory card.

More specifically, as shown in FIG. 9, the memory card of the third embodiment comprises a verify control logic circuit 150 which is not included in that of the first embodiment, and is so constructed that a key which represents an authorized user and a key by which data is input to the terminal device are verified with each other based on a verify command output from the command decoder 20 and, if both the keys coincide with each other, a rewrite (erase) enable signal EN is supplied to the erase control logic 210*b*.

As shown in FIG. 10, the enable signal EN is input to the AND gate 214 for carrying out an AND operation between the output of EPROM 200 and the timing signal $C_0$ of timing control circuit 212. The key representing the authorized user is stored in a key memory 160 which is one of memories of a chip.

Therefore, the erase control logic 210*b* is not allowed to rewrite data of the user memory 100 until it receives the enable signal EN. The enable signal EN is not output from the verify control logic 150 unless the key representing the authorized user is input thereto. Even though the erase command ERASE is input from the terminal device, the erase control signal ERS is not output from the erase control logic 210*b*. A third party other than the authorized user can be reliably prevented from rewriting the memory card.

Though not shown, the second embodiment can be modified like the third embodiment. If the enable signal EN is supplied to the AND gate 242 of the second embodiment, the erase control logic 210a is not allowed to rewrite data of the user memory 100 until it receives the enable signal EN.

As has been described above, according to the present invention, since the number of times of erase is counted, using a memory which cannot be externally rewritten or a counter which cannot be cleared, to inhibit an erase operation from being performed over a predetermined number of times, an adverse influence of erase can be minimized even though a dishonest erase operation is carried out by decoding an erase command. Since, furthermore, a key is used to determine whether a user is authorized to perform an erase operation, it is very difficult to do it dishonestly, Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, in the above embodiments, the memory card is used as a prepaid card for public telephones; however, it can be used as whatever prepaid cards. Moreover, the memory card is not limited to the prepaid cards, but can be used versatilely.

What is claimed is:

1. A memory card comprising:

memory means capable of being initialized;

means for counting the number of times said memory means is initialized, the counting means being an externally inaccessible counting means; and initialization means for initializing said memory means upon receiving an initialization command only when the number of times counted by said counting means is smaller than a predetermined value, initializing of said memory means being inhibited when the number of times counted by said counting means is equal to or larger than a predetermined value.

2. The memory card according to claim 1, in which said memory means includes a flash erase type EEPROM.

3. The memory card according to claim 1, in which said memory means includes a flash erase type EEPROM having a large number of memory cells, a predetermined number of memory cells of said large number of memory cells being set to a first level in an initial state and changed in sequence from the first level to a second level, and said initializing means simultaneously changes levels of said predetermined number of memory cells to the first level.

4. The memory card according to claim 1, in which said counting means includes an EPROM whose data is rewritten every initialization of said memory means.

5. The memory card according to claim 1, in which said counting means includes a large number of fuses, and one of said large number of fuses is cut off every initialization of said memory means.

6. The memory card according to claim 1, in which said counting means includes a counter which is cleared before a first initialization of said memory means starts and which counts up every initialization of said memory means.

7. The memory card according to claim 1, in which said memory means stores prepaid money data.

8. The memory card according to claim 1, in which said counting means includes a wired logic circuit, and said initialization control means includes a logic gate for supplying the initialization command to said initializing means, said logic gate being rendered nonconductive when the number of times of initialization amounts to the predetermined value.

9. A memory card comprising:

memory means capable of being initialized;

means for storing a key necessary for initializing said memory means;

means for verifying whether a key input by an operator coincides with the key stored in said storing means;

means for counting the number of times said memory means is initialized, the counting means being an externally inaccessible counting means; and initialization means for initializing said memory means upon receiving an initialization command only when the number of times counted by said counting means is smaller than a predetermined value, initializing of said memory means being inhibited when the number of times counted by said counting means is equal to or larger than a predetermined value.

10. The memory card according to claim 9, in which said memory means includes a flash erase type EEPROM.

11. The memory card according to claim 9, in which said memory means includes a flash erase type EEPROM having a large number of memory cells, a predetermined number of memory cells of said large number of memory cells being set to a first level in an initial state and changed in sequence from the first level to a second level, and said initializing means simultaneously changes levels of said predetermined number of memory cells to the first level.

12. The memory card according to claim 9, in which said counting means includes an EPROM whose data is rewritten every initialization of said memory means.

13. The memory card according to claim 9, in which said counting means includes a large number of fuses, and one of said large number of fuses is cut off every initialization of said memory means.

14. The memory card according to claim 9, in which said counting means includes a counter which is cleared before a first initialization of said memory means starts and which counts up every initialization of said memory means.

15. The memory card according to claim 9, in which said memory means stores prepaid money data.

16. The memory card according to claim 9, in which said counting means includes a wired logic circuit, and said initialization control means includes a logic gate for supplying the initialization command to said initializing means, said logic gate being rendered nonconductive when the number of times of initialization amounts to the predetermined value.

* * * * *